United States Patent
Shabbir et al.

(10) Patent No.: US 10,405,461 B2
(45) Date of Patent: Sep. 3, 2019

(54) SYSTEMS AND METHODS FOR FAN PERFORMANCE-BASED SCALING OF THERMAL CONTROL PARAMETERS

(71) Applicant: Dell Products L.P., Round Rock, TX (US)

(72) Inventors: Hasnain Shabbir, Round Rock, TX (US); Dominick A. Lovicott, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 606 days.

(21) Appl. No.: 15/132,997

(22) Filed: Apr. 19, 2016

(65) Prior Publication Data

US 2017/0303438 A1 Oct. 19, 2017

(51) Int. Cl.
H05K 7/20 (2006.01)

(52) U.S. Cl.
CPC .................. *H05K 7/20736* (2013.01)

(58) Field of Classification Search
CPC . H05K 7/20736; H05K 7/20836; G06F 1/206
USPC .......................................................... 700/299
See application file for complete search history.

(56) References Cited

U.S. PATENT DOCUMENTS

| | | | | |
|---|---|---|---|---|
| 5,825,620 A | * | 10/1998 | Chrysler | H05K 7/206 361/695 |
| 2005/0115257 A1 | * | 6/2005 | Goth | F25B 49/02 62/186 |
| 2007/0078635 A1 | * | 4/2007 | Rasmussen | G06F 1/20 703/1 |
| 2007/0089446 A1 | * | 4/2007 | Larson | G05D 23/1931 62/259.2 |
| 2007/0162160 A1 | * | 7/2007 | Chang | G06F 1/206 700/25 |
| 2008/0320322 A1 | * | 12/2008 | Green | G06F 1/26 713/340 |
| 2009/0138313 A1 | * | 5/2009 | Morgan | G06Q 10/06 705/7.23 |
| 2009/0256512 A1 | * | 10/2009 | Begun | G06F 1/20 318/471 |
| 2011/0063778 A1 | * | 3/2011 | Brouillard | H05K 7/20645 361/678 |
| 2012/0078420 A1 | * | 3/2012 | Jensen | G05B 11/16 700/275 |
| 2012/0096248 A1 | * | 4/2012 | McCarthy | G06F 1/3203 713/1 |

(Continued)

*Primary Examiner* — Brian W Wathen
*Assistant Examiner* — Alicia M. Choi
(74) *Attorney, Agent, or Firm* — Jackson Walker L.L.P.

(57) ABSTRACT

In accordance with embodiments of the present disclosure, a system may include a cooling subsystem for cooling components of an information handling system and a thermal manager communicatively coupled to the cooling subsystem. The thermal manager may be configured to receive information regarding a reference performance metric for the cooling subsystem, based on the reference performance metric, modify at least one thermal control parameter for thermally controlling the information handling system from a baseline setting associated with a hardware configuration of the information handling system, and thermally control the information handling system in accordance with the at least one thermal control parameter as modified.

20 Claims, 4 Drawing Sheets

(56) References Cited

U.S. PATENT DOCUMENTS

| | | | |
|---|---|---|---|
| 2014/0117908 A1* | 5/2014 | Busch | H02P 1/04 318/471 |
| 2014/0192475 A1* | 7/2014 | Tunks | H05K 7/20836 361/679.31 |
| 2017/0219239 A1* | 8/2017 | Lovicott | F04D 25/08 |

* cited by examiner

| SUPPORTED AMBIENT TEMPERATURE | $T_{amb\,sup-3}$ | $T_{amb\,sup-2}$ | $T_{amb\,sup-1}$ | $T_{amb\,sup0}$ | $T_{amb\,sup1}$ | $T_{amb\,sup2}$ | $T_{amb\,sup3}$ |
|---|---|---|---|---|---|---|---|
| REQUIRED FAN PERFORMANCE METRIC | $METRIC_{-3}$ | $METRIC_{-2}$ | $METRIC_{-1}$ | BASELINE FAN SPEED REFERENCE $METRIC_0$ | $METRIC_1$ | $METRIC_2$ | $METRIC_3$ |
| FAN SPEED CURVE OFFSET (m) | $+m_3\%$ | $+m_2\%$ | $+m_1\%$ | 0 | $-m_1\%$ | $-m_2\%$ | $-m_3\%$ |
| SYSTEM POWER CAPPING CURVE OFFSET(n) | $-n_3$ | $-n_2$ | $-n_1$ | 0 | $+n_1$ | $+n_2$ | $+n_3$ |

SYSTEMS AND METHODS FOR FAN PERFORMANCE-BASED SCALING OF THERMAL CONTROL PARAMETERS

TECHNICAL FIELD

The present disclosure relates in general to information handling systems, and more particularly to thermal management of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, thermal management systems including air movers (e.g., cooling fans and blowers) have often been used in information handling systems to cool information handling systems and their components. Various input parameters to a thermal management system, such as measurements from temperature sensors and inventories of information handling system components are often utilized by thermal management systems to control air movers and/or throttle power consumption of components in order to provide adequate cooling of components.

In traditional thermal control systems for information handling systems, little or no provisions are present for optimizing thermal control in response to installation of upgraded fans. For example, when a fan is upgraded to a new fan having greater airflow performance, existing approaches do not include a mechanism for communicating the increased performance to a thermal control system of the information handling system. Accordingly, ambient temperature limits, system power capping limits, fan curves (e.g., pulse-width-modulation versus ambient temperature curves) and other thermal control parameters may not be updated in response to addition of the higher-performance fan unless such parameters are updated via a firmware update of the thermal control system or manual entering of new control parameters.

SUMMARY

In accordance with the teachings of the present disclosure, disadvantages and problems associated with thermal management of an information handling system may be reduced or eliminated.

In accordance with embodiments of the present disclosure, a system may include a cooling subsystem for cooling components of an information handling system and a thermal manager communicatively coupled to the cooling subsystem. The thermal manager may be configured to receive information regarding a reference performance metric for the cooling subsystem, based on the reference performance metric, modify at least one thermal control parameter for thermally controlling the information handling system from a baseline setting associated with a hardware configuration of the information handling system, and thermally control the information handling system in accordance with the at least one thermal control parameter as modified.

In accordance with these and other embodiments of the present disclosure, a method may include receiving information regarding a reference performance metric for a cooling subsystem for cooling components of an information handling system, based on the reference performance metric, modifying at least one thermal control parameter for thermally controlling an information handling system from a baseline setting associated with a hardware configuration of the information handling system, and thermally controlling the information handling system in accordance with the at least one thermal control parameter as modified.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to receive information regarding a reference performance metric for a cooling subsystem for cooling components of an information handling system, based on the reference performance metric, modify at least one thermal control parameter for thermally controlling an information handling system from a baseline setting associated with a hardware configuration of the information handling system, and thermally control the information handling system in accordance with the at least one thermal control parameter as modified.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
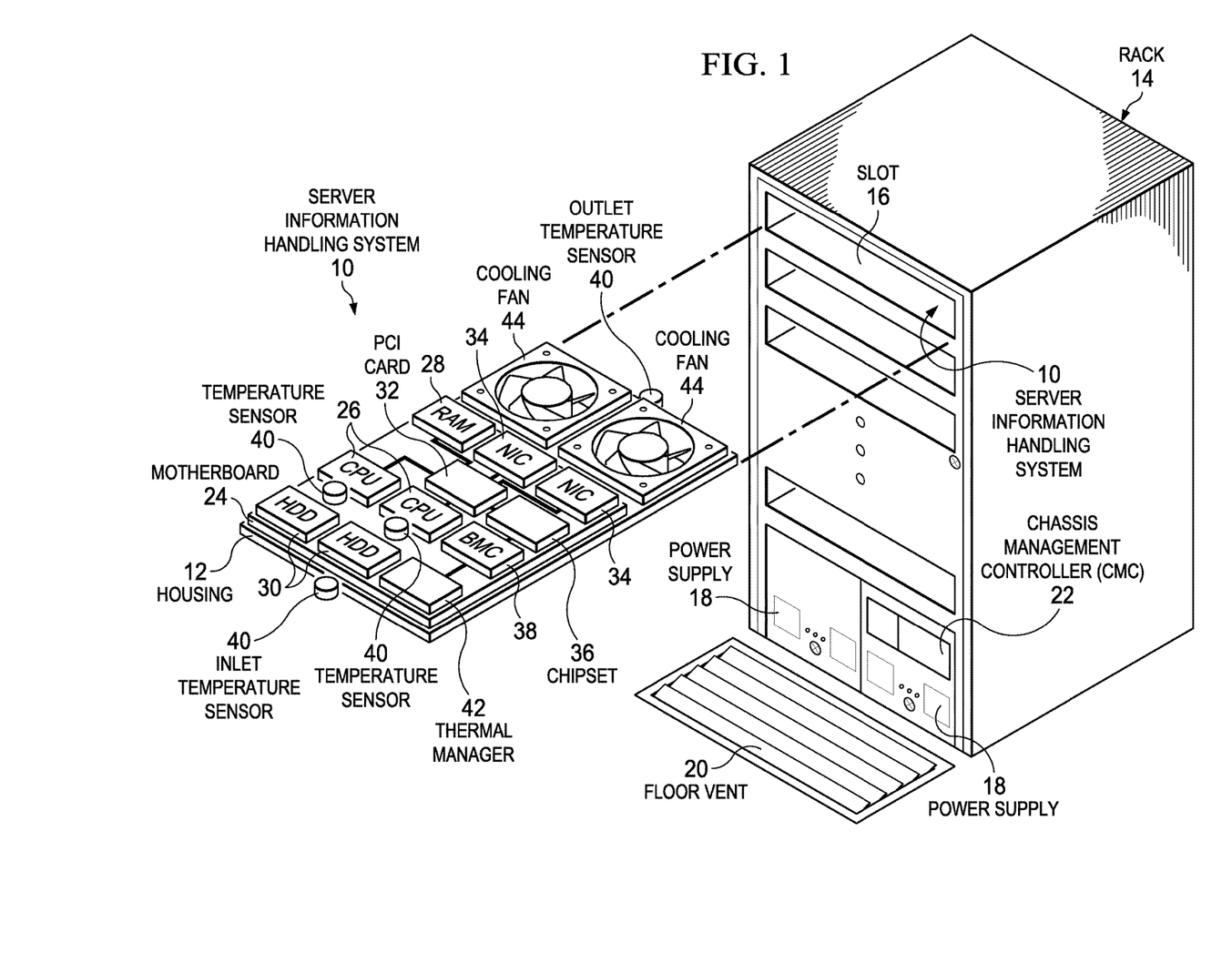
FIG. 1 illustrates a perspective view of an example information handling system, in accordance with embodiments of the present disclosure.

FIG. 1 illustrates a perspective view of an example information handling system 10, in accordance with embodiments of the present disclosure. As shown in FIG. 1, information handling system 10 may comprise a server built into a housing 12 that resides with one or more other information handling systems 10 in a rack 14. Rack 14 may comprise a plurality of vertically-stacked slots 16 that accept information handling systems 10 and a plurality of power supplies 18 that provide electrical energy to information handling systems 10. In a data center environment, rack 14 may receive pretreated cooling air provided from a floor vent 20 to aid removal of thermal energy from information handling systems 10 disposed in rack 14. Power supplies 18 may be assigned power based upon availability at the data center and may allocate power to individual information handling systems 10 under the management of a chassis management controller (CMC) 22. CMC 22 may aid coordination of operating settings so that information handling systems 10 do not exceed thermal or power usage constraints.

Housing 12 may include a motherboard 24 that provides structural support and electrical signal communication for processing components disposed in housing 12 that cooperate to process information. For example, one or more central processing units (CPUs) 26 may execute instructions stored in random access memory (RAM) 28 to process information, such as responses to server requests by client information handling systems remote from information handling system 10. One or more persistent storage devices, such as hard disk drives (HDD) 30 may store information maintained for extended periods and during power off states. A backplane communications manager, such as a PCI card 32, may interface processing components to communicate processed information, such as communications between CPUs 26 and network interface cards (NICs) 34 that are sent through a network, such as a local area network. A chipset 36 may include various processing and firmware resources for coordinating the interactions of processing components, such as a basic input/output system (BIOS). A baseboard management controller (BMC) 38 may interface with chipset 36 to provide out-of-band management functions, such as remote power up, remote power down, firmware updates, and power management. For example, BMC 38 may receive an allocation of power from CMC 22 and monitor operations of the processing components of information handling system 10 to ensure that power consumption does not exceed the allocation. As another example, BMC 38 may receive temperatures sensed by temperature sensors 40 and apply the temperatures to ensure that thermal constraints are not exceeded.

A thermal manager 42 may execute as firmware, software, or other executable code on BMC 38 to manage thermal conditions within housing 12, such as the thermal state at particular processing components or ambient temperatures at discrete locations associated with housing 12. Thermal manager 42 may control the speed at which cooling fans 44 rotate to adjust a cooling airflow rate in housing 12 so that enough excess thermal energy is removed to prevent an over-temperature condition, such as overheating of a CPU 26 or an excessive exhaust temperature as measured by an outlet temperature sensor 40. In the event that cooling fans 44 cannot provide sufficient cooling airflow to meet a thermal constraint, thermal manager 42 may reduce power consumption at one or more of the processing components to reduce the amount of thermal energy released into housing 12, such as by throttling the clock speed of one or more of CPUs 26. Thermal manager 42 may respond to extreme thermal conditions that place system integrity in jeopardy by shutting down information handling system 10, such as might happen if floor vent 20 fails to provide treated air due to a data center cooling system failure. As used herein, the term "cooling fan" may refer to any mechanical or electromechanical system, apparatus, or device operable to move air and/or other gases in order to cool components of an information handling system 10. Accordingly, "cooling fan" may refer to a fan (e.g., a rotating arrangement of vanes or blades which act on the air), a blower (e.g., centrifugal fan that employs rotating impellers to accelerate air received at its intake and change the direction of the airflow), and/or any other air moving system employing rotating and/or other moving components of such air moving system which are driven by a motor under the control of thermal manager 42.

In order to manage thermal conditions associated with housing 12, thermal manager 42 may, based on a hardware inventory of an information handling system 10, determine a thermal configuration for the information handling system 10, and based on such thermal configuration, apply thermal control parameters (e.g., ambient temperature limits, ambient temperature-based power consumption limits of information handling system 10, ambient temperature-based fan speeds, etc.). In addition, as described in greater detail below, thermal manager 42 may scale such thermal control parameters based on a performance metric (e.g., a reference airflow rate) of cooling fans 44.

Figure 2:
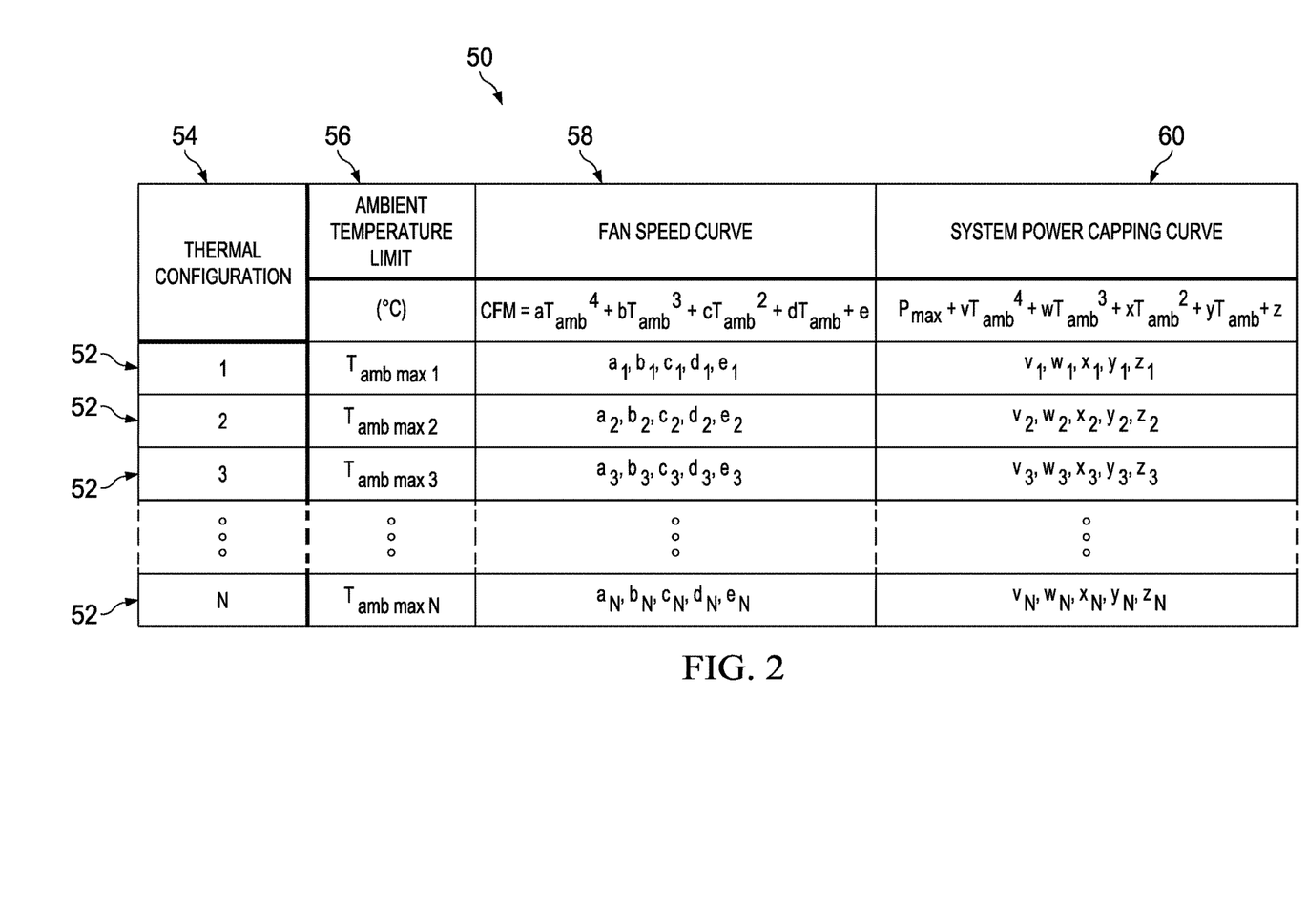
FIG. 2 illustrates an example thermal table setting forth mappings between component inventory-based thermal configurations and thermal control parameters associated with each thermal configuration, in accordance with embodiments of the present disclosure.

FIG. 2 illustrates an example thermal table 50 setting forth mappings between component inventory-based thermal configurations and thermal control parameters associated with each thermal configuration, in accordance with embodiments of the present disclosure. Thermal table 50 may be stored in a memory or other computer-readable medium integral to or otherwise accessible to thermal manager 42. As shown in FIG. 2, thermal table 50 may include a plurality of entries 52. Each entry 52 may define, based on a hardware inventory of an information handling system 10, a thermal configuration 54 and parameters associated with such thermal configuration 54 including, without limitation, an ambient temperature limit 56, a fan speed curve 58 (e.g., defining a fan speed versus ambient temperature for cooling fans 44), and a system power capping curve 60 (e.g., defining a maximum power limit versus ambient temperature, such that thermal manager 42 may throttle components of information handling system 10 or otherwise reduce power consumption of such components in order to maintain power consumption below a maximum power limit for such ambient temperature). Fan speed curve 58 and system power capping curve 60 may each be defined by coefficients (e.g., coefficients a, b, c, d, e, v, w, x, y, z) of a polynomial for each curve.

In some embodiments, each thermal configuration 54 and its associated parameters may apply to a baseline reference fan performance metric (e.g., a baseline reference maximum airflow rate) for cooling fans 44. Accordingly, if cooling fans 44 installed in housing 12 have such baseline reference performance metric, then thermal manager 42 may control operation of such cooling fans 44 in accordance with thermal control parameters (e.g., ambient temperature limit 56, a fan speed curve 58, and system power capping curve 60) associated with the thermal configuration 54 associated with the hardware inventory of information handling system 10. However, if one or more cooling fans 44 possess a different reference fan performance metric (e.g., a reference maximum airflow rate different than the baseline reference maximum airflow rate), then thermal manager 42 may modify thermal control parameters accordingly, as described in greater detail below.

To implement the above, each cooling fan 44 may have stored in a memory or other computer readable medium (e.g., a field replaceable unit memory) integral thereto its associated reference fan performance metric. In operation, thermal manager 42 may (e.g., via a suitable communication bus or other communications path interfaced between cooling fans 44 and BMC 38) receive the reference fan performance metric from each cooling fan 44. Based on the received reference fan performance metrics, thermal manager 42 may modify thermal control parameters accordingly to account for differences in reference fan performance metrics from the baseline reference fan performance metric.

Figure 3:
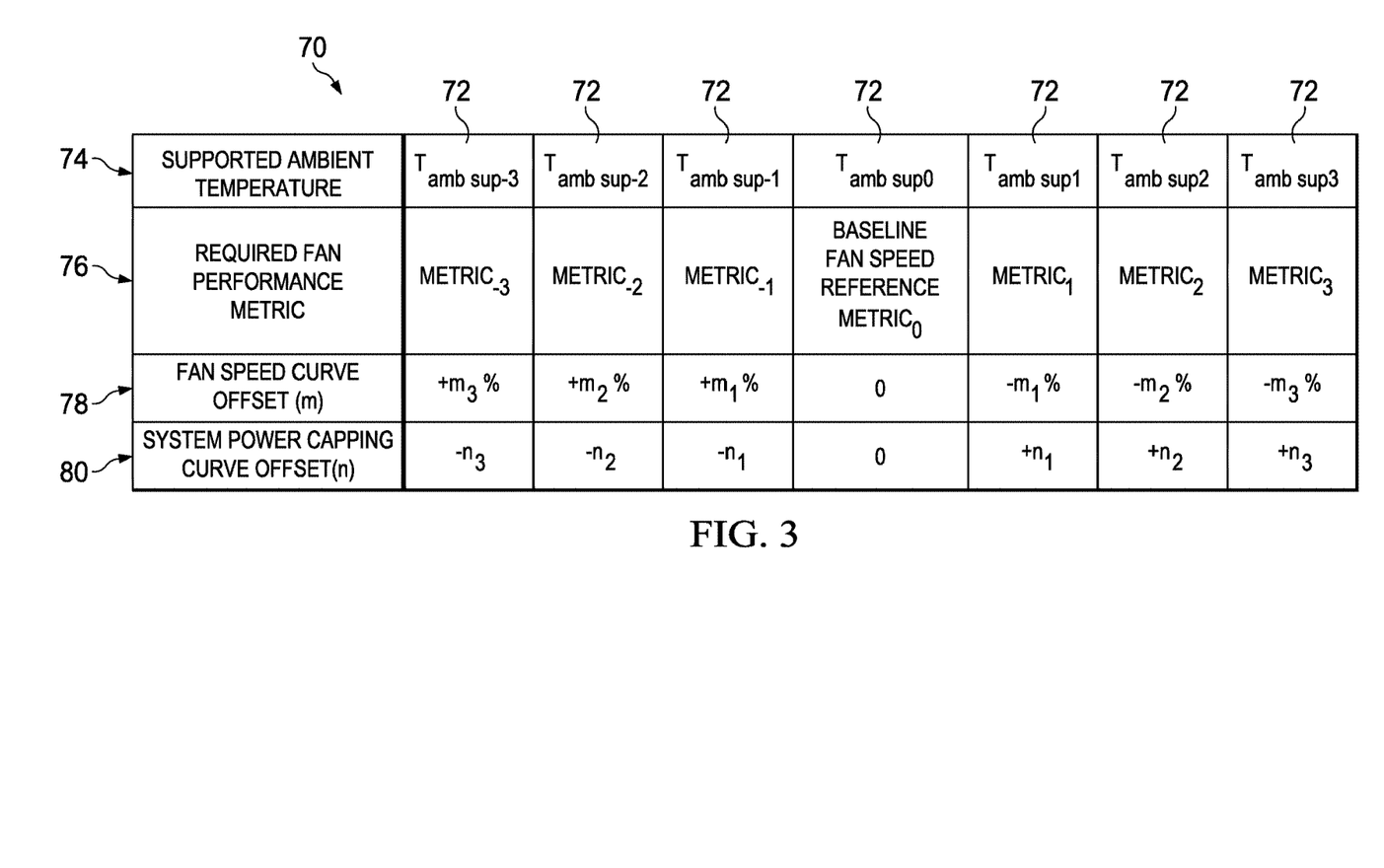
FIG. 3 illustrates an example thermal control parameter scaling table setting forth mappings between reference fan performance metrics and thermal control offsets associated with each reference fan performance metric, in accordance with embodiments of the present disclosure.

FIG. 3 illustrates an example thermal control parameter scaling table 70 setting forth supported ambient temperatures and mappings between such supported ambient temperatures and thermal control parameters required to support each of such supported ambient temperatures, in accordance with embodiments of the present disclosure. Thermal control parameter scaling table 70 may be stored in a memory or other computer-readable medium integral to or otherwise accessible to thermal manager 42. As shown in FIG. 3, thermal control parameter scaling table 70 may include a plurality of entries 72. Each entry 72 may define for each supported ambient temperature 74 a required fan performance metric 76 (e.g., required airflow rate) and one or more offsets to be applied to thermal control parameters set forth in thermal table 50 based on a supported ambient temperature 74. Such offsets may include, without limitation, a fan speed curve offset 78, and a system power capping curve offset 80. For example, fan speed curve offset 78 may define a percentage (e.g., m %) by which each coefficient of a baseline fan speed curve 58 may be increased or decreased for the particular reference fan performance metric. As another example, system power capping curve offset 80 may define a value (e.g., n) by which a constant coefficient term (e.g., z) of a baseline system power capping curve 60 may be increased or decreased for the particular reference fan performance metric.

Thus, for a particular reference fan performance metric for a cooling fan 44, thermal manager 42 may determine from thermal control parameter scaling table 70 a supported ambient temperature 72 that is supported by such reference fan performance metric (e.g., by matching the reference fan performance metric to the same or an approximately same value for a required fan performance metric 76 in thermal control parameter scaling table 70). In addition, thermal manager 42 may apply offsets (e.g., fan speed curve offset 78, system power capping curve offset 80) from the entry 72 associated with such supported ambient temperature 72 to the thermal control parameters associated with the thermal configuration 52 read from thermal table 50.

Figure 4:
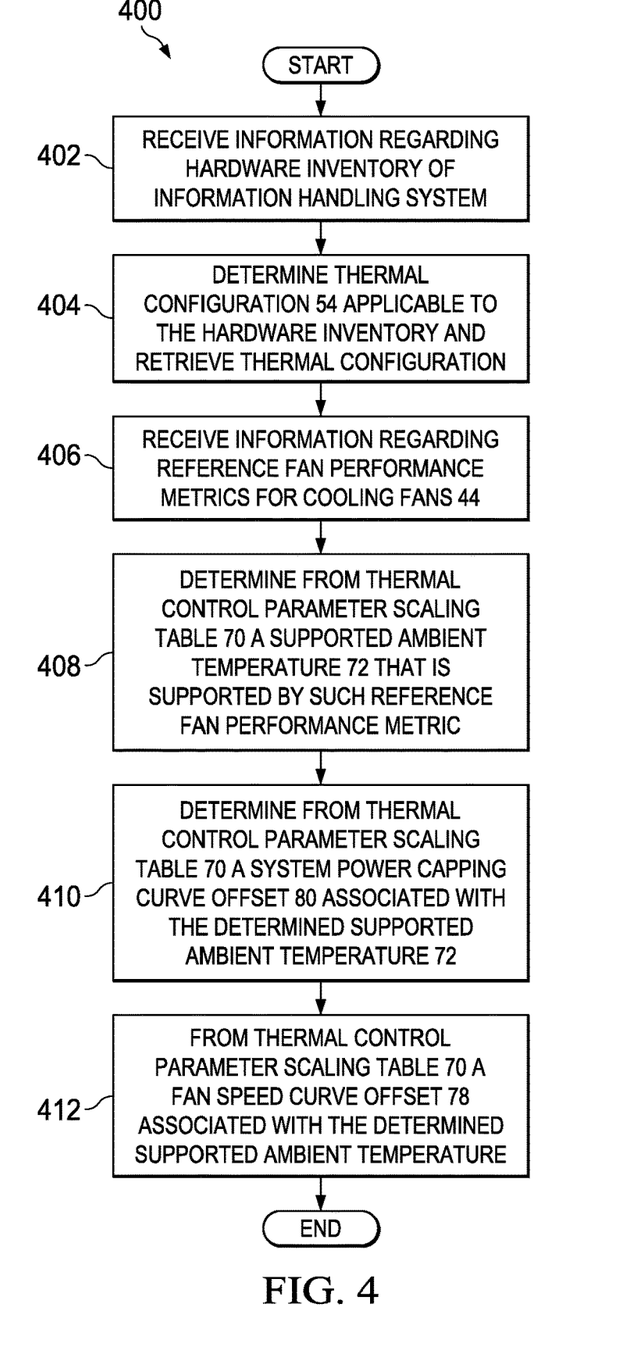
FIG. 4 illustrates a flow chart of an example method for fan-based performance scaling of thermal control parameters, in accordance with embodiments of the present disclosure.

FIG. 4 illustrates a flow chart of an example method 400 for fan-based performance scaling of thermal control parameters, in accordance with embodiments of the present disclosure. According to some embodiments, method 400 may begin at step 402. As noted above, teachings of the present disclosure may be implemented in a variety of configurations of information handling system 10. As such, the preferred initialization point for method 400 and the order of the steps comprising method 400 may depend on the implementation chosen.

At step 402, thermal manager 42 may receive information regarding hardware inventory of information handling system 10. At step 404, thermal manager 42 may determine a thermal configuration 54 applicable to the hardware inventory and retrieve an entry 52 from thermal table 50 associated with such thermal configuration, including thermal control parameters for such entry 52 (e.g., fan speed curve 58 and system power capping curve 60). At step 406, thermal manager 42 may receive information regarding reference fan performance metrics (e.g., maximum airflow speeds) for cooling fans 44.

At step 408, thermal manager 42 may determine from thermal control parameter scaling table 70 a supported ambient temperature 72 that is supported by such reference fan performance metric (e.g., by matching the reference fan performance metric to the same or an approximately same value for a required fan performance metric 76 in thermal control parameter scaling table 70). In some embodiments, information handling system 10 may include multiple cooling fans 44, in which case thermal manager 42 may determine which ambient temperatures would be supported by all cooling fans 44, and apply the minimum of all such ambient temperatures as the supported ambient temperature for information handling system 10. During operation, thermal manager 42 may then apply such supported ambient temperature when determining whether to issue thermal warnings or alerts relating to information handling system 10.

At step 410, thermal manager 42 may determine from thermal control parameter scaling table 70 a system power capping curve offset 80 associated with the determined supported ambient temperature 72 and apply such offset to the system power capping curve 60 read from thermal table 50 to define a modified system power capping curve for thermal manager 42 to apply to components of information handling system 10 during thermal control of information handling system 10.

At step 412, thermal manager 42 may determine from thermal control parameter scaling table 70 a fan speed curve offset 78 associated with the determined supported ambient temperature 72 and apply such offset to the fan speed curve 58 read from thermal table 50 to define a modified fan speed curve for thermal manager 42 to apply to cooling fans 44 during thermal control of information handling system 10.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using one or more information handling systems 10, chassis management controller 22, components thereof, and/or any other system operable to implement method 400. In certain embodiments, method 400 may be implemented partially or fully in software and/or firmware embodied in computer-readable media.

In addition to the foregoing, thermal manager 42 may be configured to, in the case in which an ambient temperature associated with an information handling system 10 is not supported by a reference fan performance metric (e.g., as determined in step 408 above), thermal manager 42 may be able to communicate to a user to recommend upgrade of cooling fans to support such ambient temperature.

Furthermore, in some embodiments, thermal manager 42 may be configured to determine if the supported ambient temperature (e.g., determined at step 408 above) aligns to any relevant industry thermal boundary conditions (e.g., Network Equipment Building System, Dell Fresh Air compliance, etc.), and communicate to a user relevant industry boundary conditions are supported and unsupported.

Although the foregoing discussion contemplates thermal control at an information handling system level by BMC 38, in some embodiments, methods and systems similar to those disclosed above may be used to facilitate thermal control of chassis-level components of rack 14 by CMC 22 in lieu of or in addition to control at an information handling system level by BMC 38. As an example, in some embodiments, CMC 22 may aggregate supported ambient temperature limits from individual information handling systems and determine an overall chassis ambient temperature limit based thereon.

In addition, although the foregoing contemplates thermal control using in an air-cooled system, methods and systems similar to those disclosed above may be used to facilitate thermal control in information handling systems employing liquid cooling, in which case one or more performance metrics may be employed to liquid cooling systems which are equivalent to those applied in to air-based cooling above.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
   a cooling subsystem for cooling components of an information handling system; and
   a thermal manager communicatively coupled to the cooling subsystem and configured to:
      receive information regarding a reference performance metric for the cooling subsystem;
      based on the reference performance metric, modify at least one thermal control parameter for thermally controlling the information handling system from a baseline setting associated with a hardware configuration of the information handling system; and thermally control the information handling system in accordance with the at least one thermal control parameter as modified;

wherein the at least one thermal control parameter comprises a system power capping curve for limiting power consumption of the information handling system as a function of temperature, and wherein modifying the system power capping curve comprises applying an offset based on the reference performance metric to a baseline system power capping curve.

2. The system of claim 1, wherein the cooling subsystem comprises one or more cooling fans configured to generate a cooling airflow in the information handling system.

3. The system of claim 2, wherein the reference performance metric is a reference airflow generated by at least one of the one or more cooling fans.

4. The system of claim 2, wherein the reference performance metric is a reference maximum airflow generated by at least one of the one or more cooling fans.

5. The system of claim 2, wherein the at least one thermal control parameter further comprises a fan speed curve of the at least one of the one or more cooling fans defining a fan speed as a function of temperature.

6. The system of claim 5, wherein modifying the fan speed curve comprises applying an offset based on the reference performance metric to a baseline fan speed curve.

7. The system of claim 1, wherein the at least one thermal control parameter further comprises a supported or maximum ambient temperature.

8. A method comprising:

receiving information regarding a reference performance metric for a cooling subsystem for cooling components of an information handling system;

based on the reference performance metric, modifying at least one thermal control parameter for thermally controlling an information handling system from a baseline setting associated with a hardware configuration of the information handling system; and thermally controlling the information handling system in accordance with the at least one thermal control parameter as modified;

wherein the at least one thermal control parameter comprises a system power capping curve for limiting power consumption of the information handling system as a function of temperature, and wherein modifying the system power capping curve comprises applying an offset based on the reference performance metric to a baseline system power capping curve.

9. The method of claim 8, wherein the cooling subsystem comprises one or more cooling fans configured to generate a cooling airflow in the information handling system.

10. The method of claim 9, wherein the reference performance metric is a reference airflow generated by the one or more cooling fans.

11. The method of claim 9, wherein the reference performance metric is a reference maximum airflow generated by the one or more cooling fans.

12. The method of claim 9, wherein the at least one thermal control parameter further comprises a fan speed curve of the one or more cooling fans defining a fan speed as a function of temperature.

13. The method of claim 12, wherein modifying the fan speed curve comprises applying an offset based on the reference performance metric to a baseline fan speed curve.

14. The method of claim 8, wherein the at least one thermal control parameter further comprises a supported or maximum ambient temperature.

15. An article of manufacture comprising:

a non-transitory computer-readable medium; and computer-executable instructions carried on the computer-readable medium, the instructions readable by a processor, the instructions, when read and executed, for causing the processor to:

receive information regarding a reference performance metric for a cooling subsystem for cooling components of an information handling system;

based on the reference performance metric, modify at least one thermal control parameter for thermally controlling an information handling system from a baseline setting associated with a hardware configuration of the information handling system; and thermally control the information handling system in accordance with the at least one thermal control parameter as modified;

wherein the at least one thermal control parameter comprises a system power capping curve for limiting power consumption of the information handling system as a function of temperature, and wherein modifying the system power capping curve comprises applying an offset based on the reference performance metric to a baseline system power capping curve.

16. The article of claim 15, wherein the cooling subsystem comprises one or more cooling fans configured to generate a cooling airflow in the information handling system.

17. The article of claim 16, wherein the reference performance metric is a reference airflow generated by the one or more cooling fans.

18. The article of claim 16, wherein the at least one thermal control parameter further comprises at least one of:

a fan speed curve of the one or more cooling fans defining a fan speed as a function of temperature; and a system power capping curve for limiting power consumption of the information handling system as a function of temperature.

19. The article of claim 16, wherein:

the at least one thermal control parameter further comprises a fan speed curve of the one or more cooling fans defining a fan speed as a function of temperature; and modifying the fan speed curve comprises applying an offset based on the reference performance metric to a baseline fan speed curve.

20. The article of claim 15, wherein the at least one thermal control parameter further comprises at least one of:

a supported ambient temperature; and a maximum ambient temperature.

* * * * *